US010063140B2

(12) United States Patent
Soleno et al.

(10) Patent No.: US 10,063,140 B2
(45) Date of Patent: Aug. 28, 2018

(54) CONTROL CIRCUITS FOR SELECTIVELY APPLYING ERROR OFFSETS TO IMPROVE DYNAMIC RESPONSE IN SWITCHING POWER CONVERTERS

(71) Applicant: Astec International Limited, Kowloon (HK)

(72) Inventors: Antonio Remetio Soleno, Mandaluyong (PH); Sudhakarababu Chakkirala, Pasig (PH); Jujo Joanis Paranal Apiag, Manatal (PH)

(73) Assignee: ASTEC INTERNATIONAL LIMITED, Kwun Tong, Kowloon (HK)

( * ) Notice: Subject to any disclaimer, the term of this patent is extended or adjusted under 35 U.S.C. 154(b) by 0 days.

(21) Appl. No.: 15/259,597

(22) Filed: Sep. 8, 2016

(65) Prior Publication Data

US 2018/0062505 A1 Mar. 1, 2018

Related U.S. Application Data

(63) Continuation-in-part of application No. 15/251,111, filed on Aug. 30, 2016, now abandoned.

(51) Int. Cl.

| | |
|---|---|
| ***H02M 3/157*** | (2006.01) |
| ***H02M 3/04*** | (2006.01) |
| ***H03K 7/08*** | (2006.01) |
| *H02H 3/20* | (2006.01) |
| *H02H 3/24* | (2006.01) |

(52) U.S. Cl.
CPC ................ *H02M 3/04* (2013.01); *H03K 7/08* (2013.01)

(58) Field of Classification Search
CPC ......... H02M 2001/0025; H02M 3/156; H02M 3/157; H02M 2001/0019; H02H 3/20; H02H 3/24; G06F 1/28
See application file for complete search history.

(56) References Cited

U.S. PATENT DOCUMENTS

| | | | |
|---|---|---|---|
| 7,446,518 B2 | 11/2008 | Carpenter et al. | |
| 7,948,224 B2 * | 5/2011 | Ng .......................... | H03F 3/217 323/284 |
| 8,344,713 B2 | 1/2013 | Shrivas et al. | |
| 8,432,656 B2 | 4/2013 | Zambetti | |
| 9,411,351 B2 * | 8/2016 | Ueno ...................... | G05F 1/575 |
| 2010/0237844 A1 | 9/2010 | Yeh | |

* cited by examiner

*Primary Examiner* — Gary L Laxton
(74) *Attorney, Agent, or Firm* — Harness, Dickey & Pierce, P.L.C.

(57) ABSTRACT

A control circuit for controlling a power circuit having a power switch includes a control loop configured to generate a control signal for the power switch of the power circuit based on an error signal determined by comparing a sensed parameter of the power circuit and a reference signal, and a positive offset signal and a negative offset signal each configured to adjust the control signal. The control circuit is configured to detect a change in an output current of the power circuit and selectively apply only one of the offset signals based on the change in the output current to adjust the control signal thereby enhancing a dynamic response to the change in the output current. Additional example control circuits, example power supplies and/or power converters including a control circuit for controlling a power switch, and example control methods are also disclosed.

20 Claims, 8 Drawing Sheets

CONTROL CIRCUITS FOR SELECTIVELY APPLYING ERROR OFFSETS TO IMPROVE DYNAMIC RESPONSE IN SWITCHING POWER CONVERTERS

CROSS-REFERENCE TO RELATED APPLICATION

This application is a continuation-in-part of U.S. patent application Ser. No. 15/251,111 filed Aug. 30, 2016. The entire disclosure of the above application is incorporated herein by reference.

FIELD

The present disclosure relates to control circuits and methods for selectively applying error offsets to adjust control signals.

BACKGROUND

This section provides background information related to the present disclosure which is not necessarily prior art.

Power converters may provide regulated outputs to loads including critical loads. Sometimes these loads change, parameters of the power converter change, etc. causing control circuits of the power converters to react to ensure the regulated outputs are maintained. As a result, the power converters' output may overshoot and/or undershoot its regulated value for a period of time. This overshoot and/or undershoot is commonly referred to a dynamic response. Sometimes, the power converters may be forced to shut down if the overshoot and/or the undershoot exceeds defined thresholds.

SUMMARY

This section provides a general summary of the disclosure, and is not a comprehensive disclosure of its full scope or all of its features.

According to one aspect of the present disclosure, a control circuit for controlling a power circuit having an input, an output for providing an output current, and at least one power switch coupled between the input and the output. The control circuit includes a control loop configured to generate a control signal for the at least one power switch of the power circuit based on an error signal determined by comparing a sensed parameter of the power circuit and a reference signal, and a positive offset signal and a negative offset signal each configured to adjust the control signal. The control circuit is configured to detect a change in the output current and selectively apply only one of the positive offset signal and the negative offset signal based on the change in the output current of the power circuit to adjust the control signal thereby enhancing a dynamic response to the change in the output current.

According to another aspect of the present disclosure, a switched mode power supply including at least one power converter including one or more power switches and configured to provide an output current, and a control circuit coupled to the at least one power converter. The control circuit includes a control loop configured to generate a control signal for the one or more power switches based on an error signal determined by comparing a sensed parameter of the at least one power converter and a reference signal, and a positive offset signal and a negative offset signal each configured to adjust the control signal. The control circuit is configured to detect a change in the output current of the at least one power converter and selectively apply only one of the positive offset signal and the negative offset signal based on the change in the output current to adjust the control signal thereby enhancing a dynamic response to the change in the output current.

According to yet another aspect of the present disclosure, a method of controlling a power switch of a power converter is disclosed. The method includes generating a control signal for the power switch of the power converter based on an error signal determined by a comparison between a sensed parameter of the power converter and a reference signal, detecting a change in an output current of the power converter, and selectively applying only one of a positive offset signal and a negative offset signal based on the change in the output current of the power converter to adjust the control signal.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts and/or features throughout the several views of the drawings.

DETAILED DESCRIPTION

Figure 1:
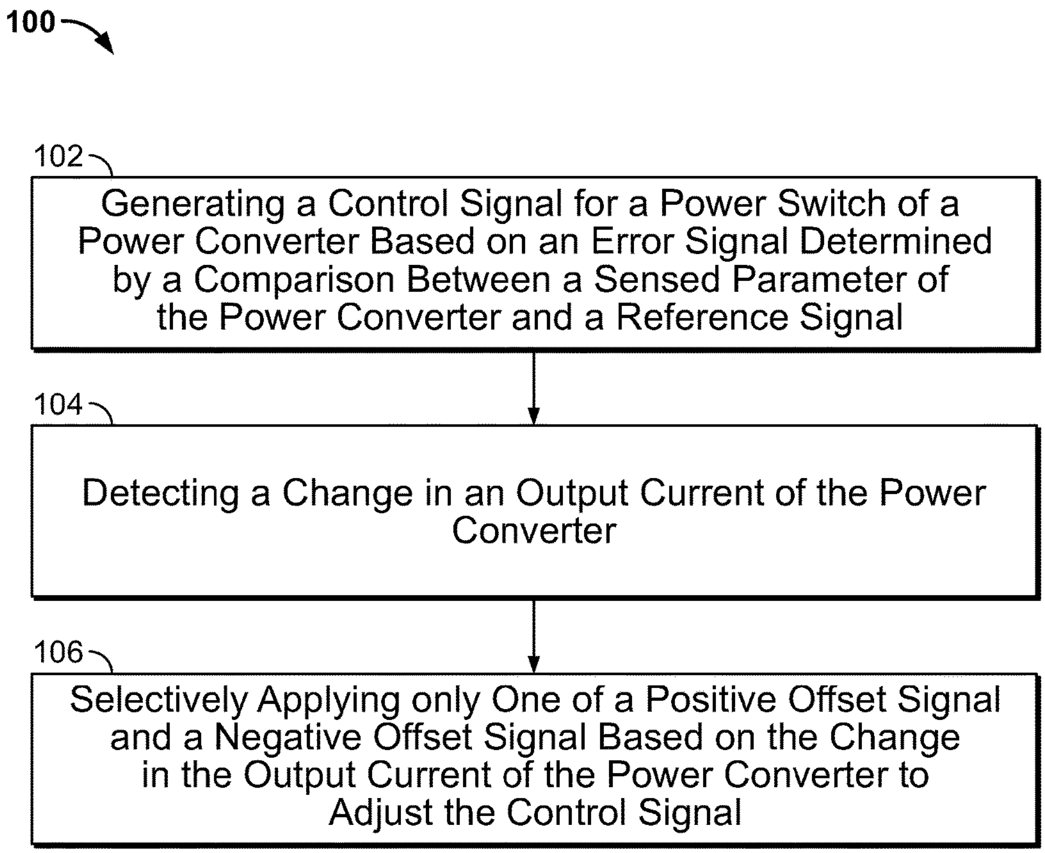
FIG. 1 is a flow diagram of a method of controlling a power switch of a power converter by selectively applying only one of a positive offset signal and a negative offset signal to adjust a control signal for the power switch according to one example embodiment of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

A method of controlling a power switch of a power converter according to one example embodiment of the present disclosure is illustrated in FIG. 1 and indicated generally by reference number 100. As shown in FIG. 1, the method 100 includes generating a control signal for the power switch of the power converter based on an error signal determined by a comparison between a sensed parameter of the power converter and a reference signal in block 102, detecting a change in an output current of the power converter in block 104, and selectively applying only one of a positive offset signal and a negative offset signal based on the change (e.g., a delta) in the output current of the power converter to adjust the control signal in block 106.

By selectively applying one of the positive offset signal and the negative offset to adjust the control signal, a dynamic response due to a change in the load may be improved compared to power converters having control circuits not employing the offsets. For example, when a load coupled to the power converter changes, the output current provided to the load changes. This causes a regulated output voltage of the power converter to experience a dynamic response such as undershoot and/or overshoot depending on the change in the output current. In such cases, the control signal is adjusted until the output voltage is again regulated at a desired voltage. As further explained below, this control signal may be adjusted more, more quickly, etc. than conventional power converters by applying the positive offset signal and/or the negative offset. As a result, the dynamic response may be improved compared to other known power converters.

For example, the control signal may include a pulse width modulation (PWM) control signal, a frequency modulation (FM) control signal, etc. to control the power switch of the power converter. A duty cycle (e.g., if using PWM control) and a frequency (e.g., if using FM control) are generally adjusted as a function of a magnitude of the error signal and a control loop response. For example, if a gain of the control loop is fixed (and therefore the control loop response is substantially fixed), a change in the magnitude of the error signal is proportional to a change in the duty cycle or the frequency of the control signal. In other embodiments, and as further explained below, the duty cycle of the PWM control signal and/or the frequency of the FM control signal may be adjusted without, for example, changing the magnitude of the error signal.

Additionally, the error signal can be considered positive if the sensed parameter is less than the reference signal and negative if the sensed parameter is greater than the reference signal. If the error signal is positive, the duty cycle of the control signal can be increased or the frequency of the control signal can be decreased to regulate the output voltage. In contrast, the duty cycle can be decreased or the frequency can be increased to regulate the output voltage if the error signal is negative.

If the offset signal(s) are applied to a signal (e.g., the sensed parameter, the error signal, the reference signal, etc.) in the control loop as further explained below, a magnitude of the error signal may be adjusted differently than if the offset signals were not applied. For example, the magnitude of the error signal may be increased more, increased faster (e.g., the rate of increase), etc. due to the offset signals compared to conventional systems. As a result, the duty cycle or the frequency of the control signal changes faster, more significantly, etc. than conventional systems. This results in a faster control loop response time. Thus, if the power converter experiences a change in the output current, one of the offset signals may be applied to change the control signal faster, more significantly, etc. than conventional systems thereby reducing an undershoot and/or an overshoot (due to the change in the output current) and a settling time of the output voltage.

One or both offset signals may be applied at a time-based on the change in the output current. For example, the positive offset signal may be selectively applied in response to an increase in the output current (e.g., a load current step from low to high). Likewise, the negative offset signal may be selectively applied in response to a decrease in the output current (e.g., a load current step from high to low). Alternatively, the positive offset signal may be selectively applied in response to a decrease in the output current and the negative offset signal may be selectively applied in response to an increase in the output current.

In some embodiments, the particular offset signal is applied after detecting any increase and/or any decrease in the output current. In other examples, the particular offset signal may be applied in response to a defined amount of change in the output current. For example, the particular offset signal may be selectively applied if the change in the output current is greater than a defined threshold. This defined threshold may be fixed (e.g., a preset value, a value determined during operation, etc.) and/or variable based on one or more power converter parameters, user defined parameters, etc. In some examples, the defined threshold is stored in memory as further explained below.

For example, the defined threshold may be a 15 percent change in the output current. Thus, if the output current changes between 245 A (e.g., at full load) and 205 A, the output current changes about 16 percent. As the change in the output current is greater than the defined threshold of 15 percent, an offset signal may be applied. In some embodiments, the defined threshold may be a 40 percent change in the output current. In such examples, an offset signal may be applied if the output current changes between 245 A and 134 A (e.g., about a 45 percent change), between 220 A and 110 A (e.g., about a 50 percent change), etc. In other embodiments, the defined threshold may be another suitable percent change in the output current including, for example, a 20 percent change, a 30 percent change, a value less than 15 percent, a value more than 40 percent, etc.

In other examples, the particular offset signal may be selectively applied based on a change in the output current and another parameter. For example, one of the offset signals may be applied if the output current changes (e.g., increases, decreases below a defined threshold, etc.) for a defined period of time, etc.

The amount of the offset signal applied may be determined based on one or more power circuit parameters. For example, the amount (e.g., a magnitude) of the offset signal applied may be based on a size of the error signal which is based in part on the change in the output current.

The particular offset signal applied may be fixed or varied. In some examples, the positive offset signal and/or the negative offset signal may be set at a particular value, varied based on an amount of change in the output current, etc. Additionally, the magnitude of the particular offset signal may vary during the application of that offset signal, vary from one use of the offset signal to the next, etc.

In some embodiments, the magnitude of the offset signal may be determined based on the changing error signal and/or another suitable parameter. For example, the magnitude of the offset signal may be set to equal two times the error signal. In such examples, if the output current increases from about 110 A to about 220 A, the output voltage may drop from a 12V (i.e., the regulated output) to about an 11.4V (i.e., a sensed output voltage). The error signal can be calculated based on those voltages. Specifically, if the reference signal is set to 2.5V, the error signal is determined to equal 0.125V (i.e., (the reference signal/the regulated output)×(the regulated output−the sensed output voltage). Thus, in this example, the error signal (i.e., 0.125V) is multiplied by two to determine a magnitude of an offset signal (i.e., 0.25V). As such, if the positive offset signal is applied (e.g., added) to the error signal to adjust the control signal, the adjusted error signal would equal 0.375V.

In other examples, the output current may increase from about 205 A to about 245 causing the output voltage to drop from a 12V to about an 11.46V. If the reference signal is set to 2.5V as before, the error signal is calculated to equal 0.1125V. In this example, the offset signal may be equal to 0.225V if the magnitude of the offset signal is equal to two times the error signal. Thus, if the positive offset signal is applied (e.g., added) to the error signal to adjust the control signal, the adjusted error signal would equal 0.3375V.

The offset signals may be applied to adjust the control signal at various locations in the control loop. For example, and as further explained below, the offset signals may be applied to the error signal, the reference signal, the sensed parameter and/or another suitable location in the control loop. In some examples, one offset signal can be applied at one location (e.g., the error signal) and the other offset signal can be applied at another location (e.g., the reference signal).

In some example embodiments, the applied offset signal may be removed in response to one or more defined events. In some preferred examples, the applied offset signal may be set to equal substantially zero, disconnected, etc. in response to the defined event(s). Thus, once the particular offset signal is removed, the control signal can return to its normal operating level. This is referred to as a two state operation (e.g, no offset signal applied and an offset signal applied). In other embodiments, the magnitude of the applied offset may decrease gradually until the offset is zero based on, for example, the changing overshoot, undershoot, etc.

The defined event(s) may be a time-based event according to a characterization of the output voltage's dynamic response. For example, the offset signal may be removed after a defined period of time of when the offset signal is applied. In such examples, the output voltage's dynamic response may be characterized based on a period of time from the detection of a change in the output current to the overshoot and/or the undershoot reaching a peak value.

This peak value may be determined based on the output voltage without the offset signal applied. For example, various peak undershoot and overshoot values corresponding to various amounts of change in the output current may be determined and stored based on characterizations of a particular power converter employed before the offset signals are implemented. Thus, once a particular change in the output current is detected and determined, an offset signal can be applied for a defined period of time corresponding to that determined change in the output current (and therefore to a peak overshoot and/or undershoot value).

In other embodiments, the defined period of time may be based on other parameters including, for example, a size of the error signal, another characteristic of the overshoot and/or the undershoot, etc.

Additionally and/or alternatively, the defined event(s) may be based on a defined voltage regulation. For example, the applied offset signal may be removed in response to the output voltage of the power converter being substantially regulated at a defined regulated output voltage after the change in the output current is detected. For example, once the output voltage is regulated within a defined percentage of the defined regulated output voltage, the applied offset signal may be removed. This defined percentage may be about 1 percent, about 1.5 percent, about 2 percent, more than 2 percent, etc.

The example methods disclosed herein may be implemented by various different control circuits. For example, FIGS. 2 and 6-11 each illustrate example control circuits configured to implement various methods including, for example, the methods disclosed herein. It should be understood, however, that the teachings of this disclosure are not limited to the particular examples shown in FIGS. 2 and 6-11, and can be applied to a wide variety of other control circuits, power converters, and/or power supplies.

Figure 2:
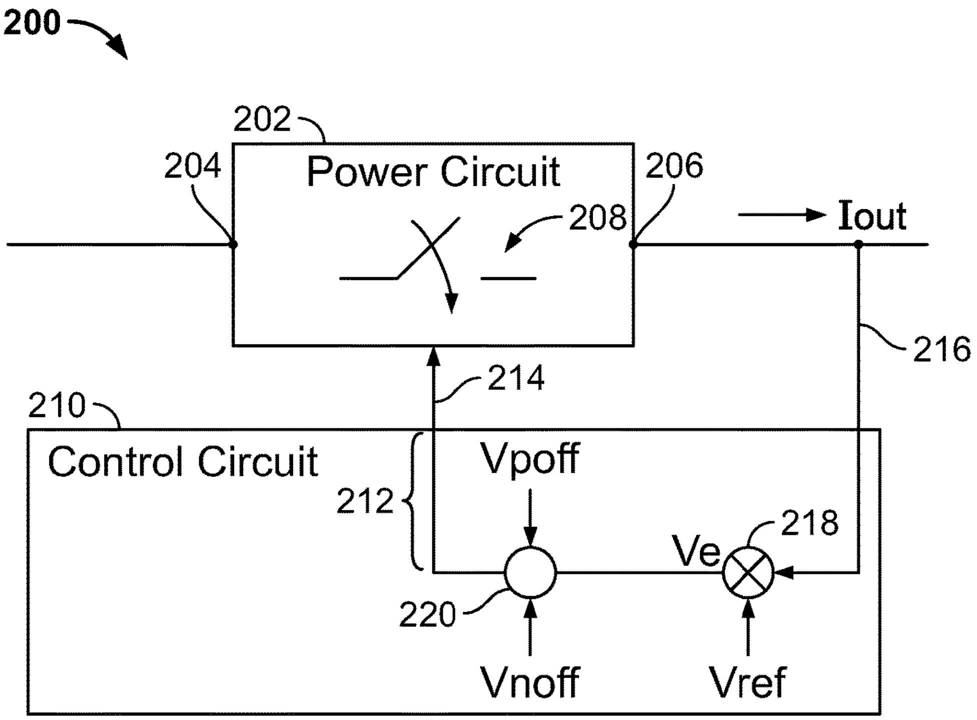
FIG. 2 is a block diagram of a power converter including a power switch and a control circuit that selectively applies one of a positive offset signal and a negative offset signal to adjust a control signal for controlling the power switch according to another example embodiment.

For example, FIG. 2 illustrates a power converter 200 including a power circuit 202 having an input 204, an output 206 for providing an output current Iout, and at least one power switch 208 coupled between the input 204 and the output 206, and a control circuit 210 for controlling the at least one power switch 208 of the power circuit 202. As shown in FIG. 2, the control circuit 210 includes a control loop 212 that generates a control signal 214 for the power switch 208 based on an error signal Ve determined by comparing a sensed parameter 216 of the power circuit 202 and a reference signal Vref. The control circuit 210 also includes a positive offset signal Vpoff and a negative offset signal Vnoff each for adjusting the control signal 214 as explained herein.

In the particular example of FIG. 2, the positive offset signal Vpoff and the negative offset signal Vnoff are applied (when applicable) to the error signal Ve. For example, the control circuit 210 includes an error signal generator 218 that computes and generates the error signal Ve (e.g., a linear signal) by subtracting the sensed parameter 216 from the reference signal Vref. The error signal Ve can then be adjusted by the particular offset signal. In the example of FIG. 2, the control circuit 210 includes an adder 220 to adjust the error signal Ve with the offset signals Vpoff, Vnoff. This adjusted error signal is then used to generate the control signal 214 for controlling the power switch 208.

In some examples, the control circuit 210 may include one or more other components in addition to and/or alternative to the error signal generator 218 and the adder 220 for generating the error signal Ve and/or the adjusted error signal Ve. For example, in some embodiments, the control circuit 210 may employ a multiplier instead of the adder 220. If employed, the multiplier multiples the change in the output current with a constant to obtain one or both offset signals. In such embodiments, a filter (e.g., a high pass filter, etc.) can be coupled to the multiplier to filter a signal representing the change in the output current.

As explained herein, the control circuit 210 can detect a change in the output current Iout and selectively apply one of the offset signals Vpoff, Vnoff based on the change in the output current Iout to adjust the control signal 214 thereby enhancing a dynamic response to the change in the output current Iout. For example, the control circuit 210 may apply the positive offset signal Vpoff in response to an increase in the output current and apply the negative offset signal Vnoff in response to a decrease in the output current. In some examples, the control circuit 210 may apply the positive offset signal Vpoff and/or the negative offset signal Vnoff after detecting any increase or any decrease in the output current, if the change in the output current is greater than a defined threshold, etc. as explained above.

Figure 3A:
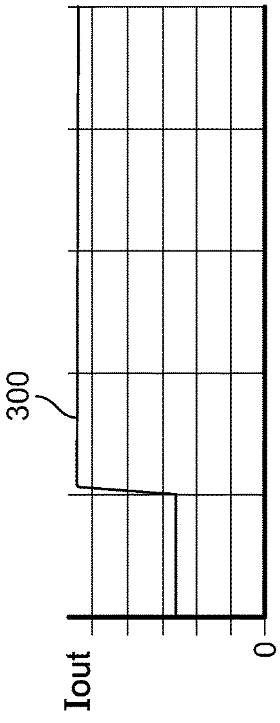
FIG. 3A illustrates a waveform representing a step up in an output current of the power converter of FIG. 2
Figure 3B:
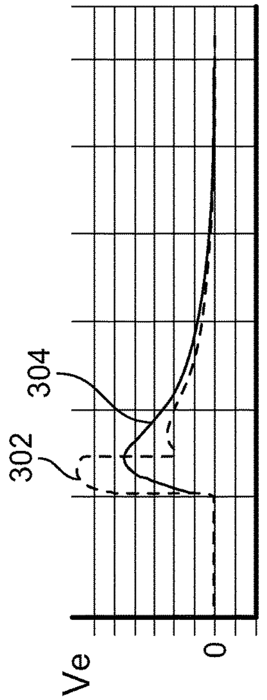
FIG. 3B illustrates waveforms representing an error signal of the power converter of FIG. 2, when the positive offset signal is applied and not applied.
Figure 3C:
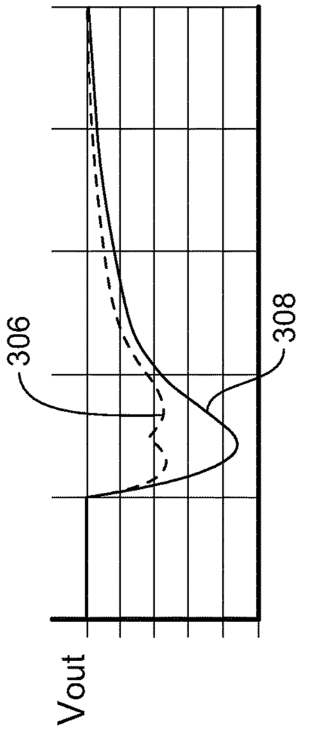
FIG. 3C illustrates waveforms representing an output voltage of the power converter of FIG. 2, when the positive offset signal is applied and not applied.

For example, FIGS. 3A, 3B, 3C illustrate waveforms 300, 302, 304, 306, 308 representing a step up in the output current Iout of the power converter 200, the error signal Ve of the control circuit 210, and an output voltage Vout of the power converter 200. In particular, the waveforms 302, 304 represent the error signal Ve with the positive offset signal Vpoff and without the positive offset signal Vpoff, respectively. The waveforms 306, 308 represent the output voltage Vout with the positive offset signal Vpoff applied to the error signal Ve and without the positive offset signal Vpoff applied to the error signal Ve, respectively.

As shown in FIGS. 3A and 3B, the positive offset signal Vpoff is applied in response to a change (e.g., a delta) in the output current Iout being greater than a defined threshold. In this particular example, the defined threshold is about a 10 percent change in the output current. It should be apparent that any other suitable threshold may be utilized based on specifications, desired performance, etc.

As shown, the error signal Ve is adjusted when the positive offset signal Vpoff is applied. For example, the magnitude of the error signal Ve is increased, the error signal Ve is increased faster (e.g., the rate of increase), etc. compared to the error signal Ve not adjusted with the positive offset signal Vpoff. This adjustment in the error signal Ve causes the control signal 214 to adjust accordingly. As a result, the output voltage undershoot (e.g., the dynamic response) of the power converter 200 is reduced when the positive offset signal Vpoff is applied compared to when it is not applied, as shown in the waveforms 306, 308 of FIG. 3C.

Figure 4A:
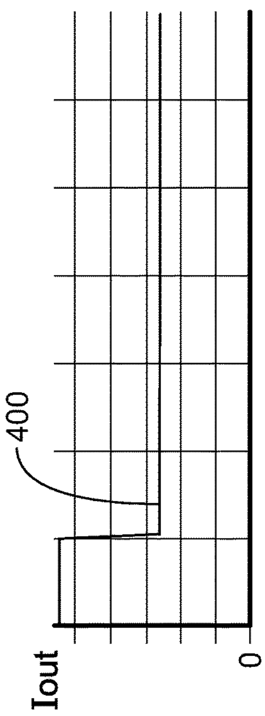
FIG. 4A illustrates a waveform representing a step down in an output current of the power converter of FIG. 2
Figure 4B:
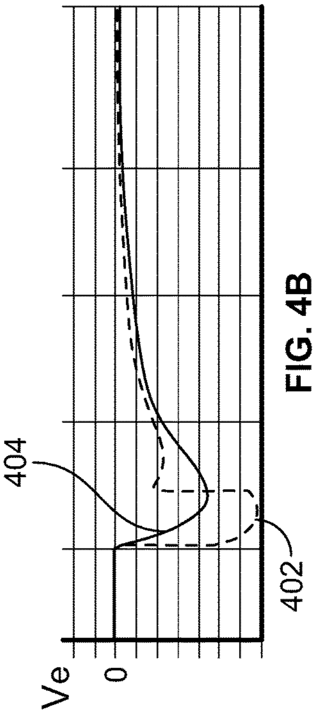
FIG. 4B illustrates waveforms representing an error signal of the power converter of FIG. 2, when the negative offset signal is applied and not applied.
Figure 4C:
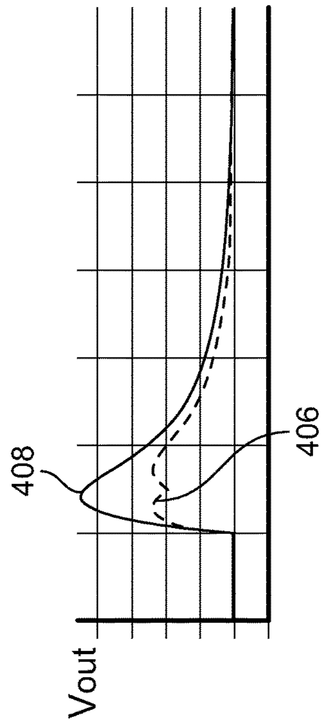
FIG. 4C illustrates waveforms representing an output voltage of the power converter of FIG. 2, when the negative offset signal is applied and not applied.

FIGS. 4A, 4B, 4C illustrate waveforms 400, 402, 404, 406, 408 similar to the waveforms 300, 302, 304, 306, 308 of FIGS. 3A, 3B, 3C, but representing a step down in the output current Iout (the waveform 400). The waveforms 402, 404 represent the error signal Ve with the negative offset signal Vnoff and without the negative offset signal Vnoff, respectively. The waveforms 406, 408 represent the output voltage Vout with the negative offset signal Vnoff applied to the error signal Ve and without the negative offset signal Vnoff applied to the error signal Ve, respectively.

Similar to the positive offset signal Vpoff, the negative offset signal Vnoff is applied in response to a change in the output current Iout being greater than a defined threshold, as shown in FIGS. 4A and 4B. This defined threshold can be the same as or different than the defined threshold triggering the positive offset signal Vpoff. In this particular example, the defined threshold is about a 10 percent change in the output current. It should be apparent that any other suitable threshold may be utilized based on specifications, desired performance, etc.

As shown, the error signal Ve is adjusted similarly to the error signal Ve of FIG. 3B, but in the opposite direction. In particular, the magnitude of the error signal Ve is increased (in the opposite direction) and at a faster rate, etc. when the negative offset signal Vnoff is applied (waveform 402) compared to the error signal Ve not adjusted with the negative offset signal Vnoff (waveform 404). This adjustment causes the control signal 214 to adjust thereby reducing the output voltage overshoot (e.g., the dynamic response) of the power converter 200 when the negative offset signal Vnoff is applied compared to when it is not applied, as shown in the waveforms 406, 408 of FIG. 4C.

Referring back to FIG. 2, the control circuit 210 can remove the applied offset signal as explained above. For example, control circuit 210 can remove the applied offset signal after a defined period of time corresponding to an overshoot or undershoot reaching its peak value, to the output voltage returning to a substantially regulated value, etc. as explained above.

Figure 5A:
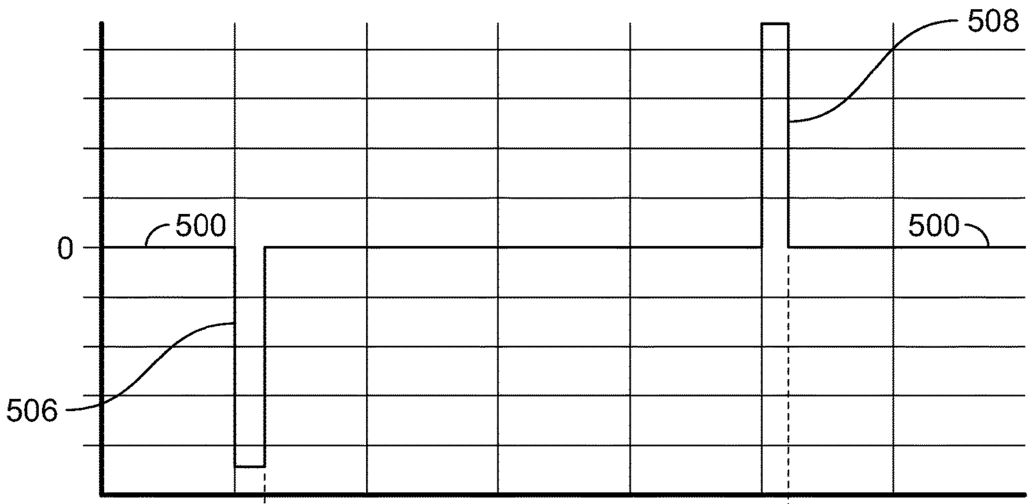
FIG. 5A illustrates a waveform representing the positive offset signal and the negative offset signal of FIG. 2.
Figure 5B:
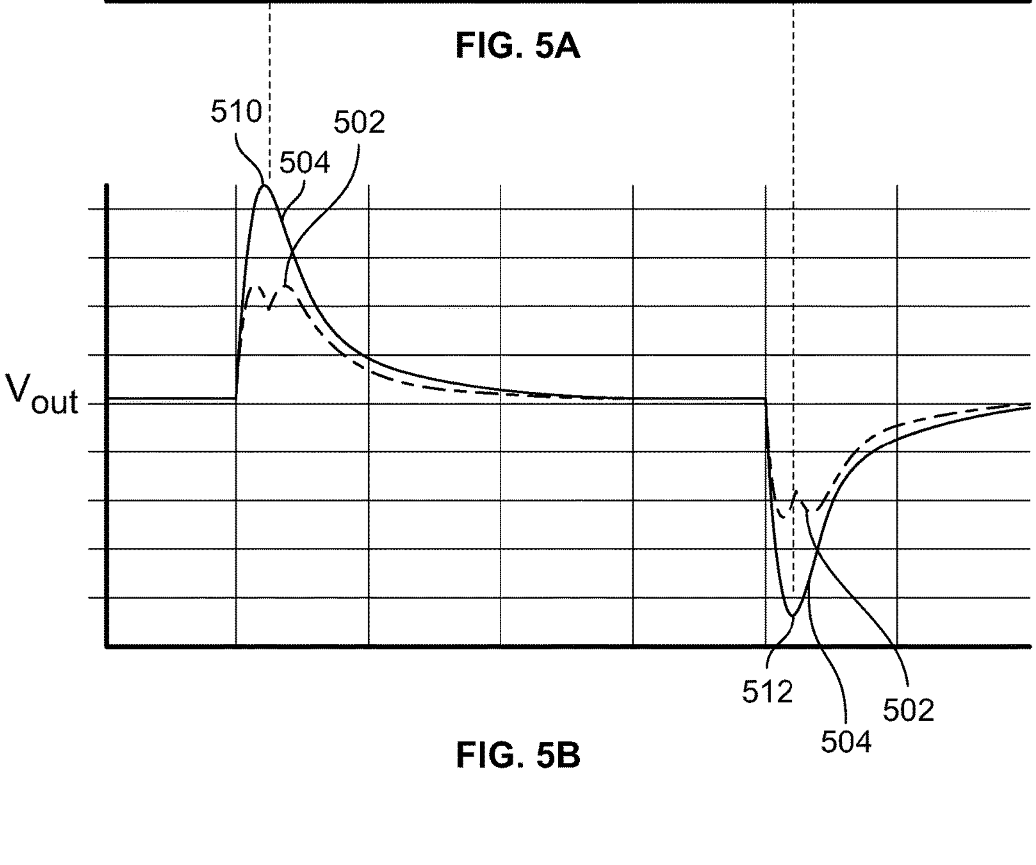
FIG. 5B illustrates waveforms representing the output voltage of the power converter of FIG. 2, when the offset signals of FIG. 5A are applied and not applied.

For example, FIGS. 5A, 5B illustrate waveforms 500, 502, 504 representing an applied negative offset signal Vnoff (portion 506 of the waveform 500), an applied positive offset signal Vpoff (portion 508 of the waveform 500), and the output voltage of the power converter 200. The waveform 502 represents the output voltage when the offset signals Vpoff, Vnoff are applied and the waveform 504 represents the output voltage when the offset signals Vpoff, Vnoff are not applied. As shown, the dynamic response (e.g., the output voltage overshoot, the output voltage undershoot, etc.) is reduced when the offset signals Vpoff, Vnoff are applied.

In the particular example of FIGS. 5A, 5B, the offset signals Vpoff, Vnoff are applied based on a change in the output current Iout as explained above. The negative offset signal Vnoff is removed after a defined period of time. This defined period of time may be predetermined based on when a change in the output current Iout is detected and when the overshoot of the output voltage Vout without the offset signal applied (see waveform 504) reaches its peak value (indicated by reference number 510), as explained above. Similarly, the positive offset signal Vpoff is removed after a defined period of time. The defined period of time for the positive offset may be predetermined based on when a change in the output current Iout is detected and when the undershoot of the output voltage Vout without the offset signal applied (see waveform 504) reaches its peak value (indicated by reference number 512), as explained above.

Figure 6:
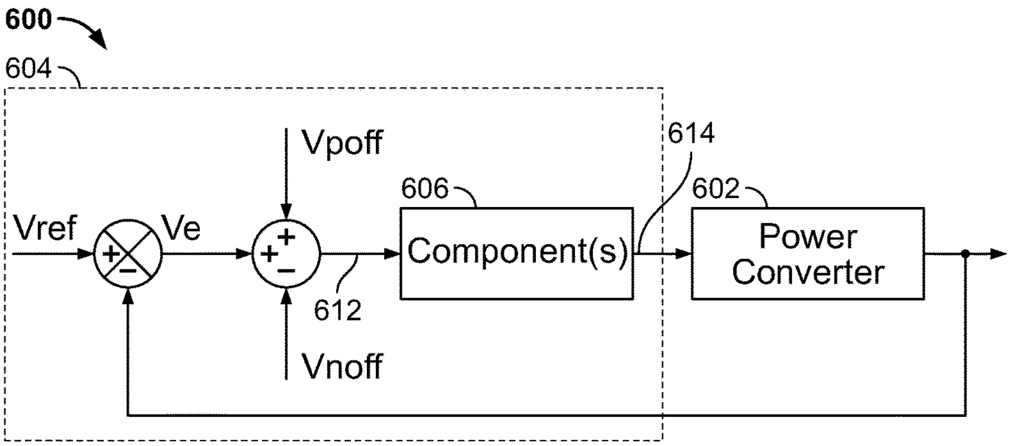
FIG. 6 is a block diagram of a switched mode power supply including a power converter and a control circuit that applies one of a positive offset signal and a negative offset signal to an error signal to adjust a control signal for controlling a power switch in the power converter according to yet another example embodiment.

FIG. 6 illustrates a switched mode power supply 600 including a power converter 602 and a control circuit 604 substantially similar to the control circuit 210 of FIG. 2. The control circuit 604, however, includes one or more components 606 that generate a control signal 614 for controlling a power switch (not shown) in the power converter 602 as explained herein.

In the example of FIG. 6, an error signal Ve is generated based on a comparison between a sensed output parameter and a reference signal Vref (as explained above). Subsequently, the control circuit 604 can adjust the error signal Ve with one of the offset signals Vpoff, Vnoff (if applicable). This adjusted or non-adjusted error signal (shown as signal 612) is provided to the component(s) 606 which generate the control signal 614 for controlling the power switch.

For example, the component(s) 606 of the control circuit 604 may include one or more amplifiers, resistors and/or other analog components. Additionally and/or alternatively, the component(s) 606 may include a proportional-integral-derivative (PID) controller, a proportional-integral (PI) controller, and/or other digital components, etc. as further explained below.

Figure 7:
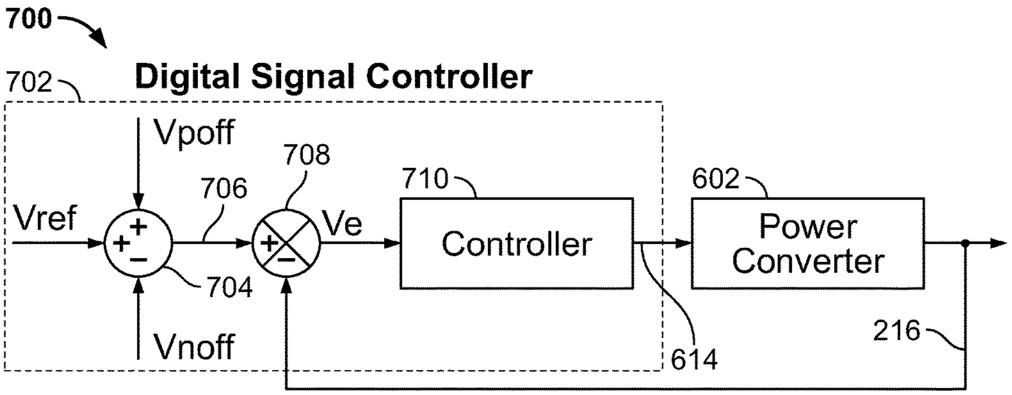
FIG. 7 is a block diagram of a switched mode power supply similar to the switched mode power supply of FIG. 6, but where the control circuit is a digital control circuit and the positive offset signal and the negative offset signal are applied to a reference signal according to another example embodiment.

FIG. 7 illustrates a power supply 700 substantially similar to the power supply 600 of FIG. 6. The power supply 700 of FIG. 7, however, includes a control circuit 702 for controlling the power switch of the power converter 602 in which the control circuit 702 applies one of the offset signals Vpoff, Vnoff (if applicable) to the reference signal Vref.

For example, the control circuit 702 includes an adder 704 and an error signal generator 708 similar to the adder 220 and the error signal generator 218 as explained above with reference to FIG. 2. In the particular embodiment of FIG. 7, the adder 704 adjusts the reference signal Vref (if applicable) with one of the offset signals and outputs an adjusted or non-adjusted reference signal (shown as signal 706). The error signal generator 708 compares the signal 706 with the sensed parameter 216 and generates the error signal Ve as explained above. This error signal Ve which is based on an adjusted or non-adjusted reference signal is then used by, for example, a controller 710 to generate the control signal 614 as explained above.

In other embodiments, the offset signals can be applied at another suitable location. For example, FIG. 8 illustrates a power supply 800 substantially similar to the power supply 700 of FIG. 7, but where the offset signals Vpoff, Vnoff are applied to the sensed parameter 216.

Figure 8:
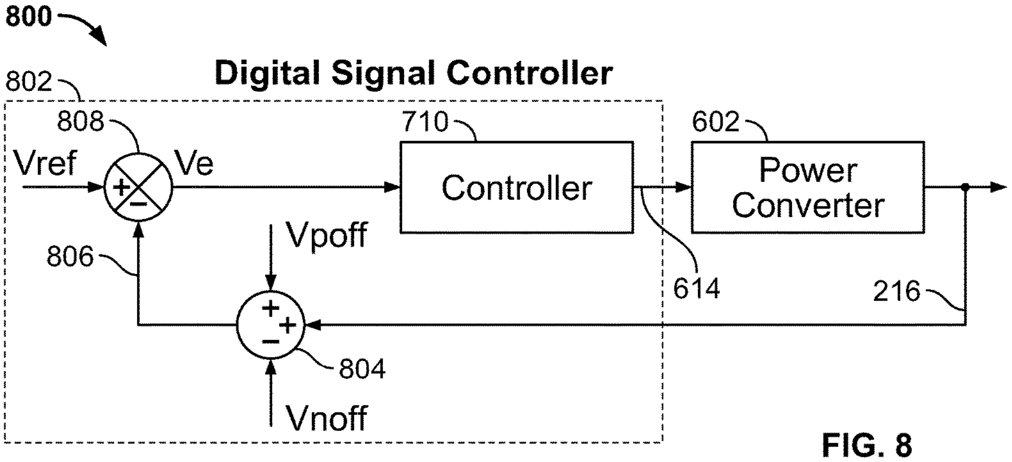
FIG. 8 is a block diagram of a switched mode power supply similar to the switched mode power supply of FIG. 6, but where the control circuit is a digital control circuit and the positive offset signal and the negative offset signal are applied to a sensed output parameter of the power converter according to yet another example embodiment.

In particular, the power supply 800 of FIG. 8 includes a control circuit 802 having an adder 804 and an error signal generator 808 substantially similar to the adder 704 and the error signal generator 708 of FIG. 7. The adder 804, however, receives the sensed parameter 216 and then may adjust the sensed parameter 216 (if applicable) with one of the offset signals Vpoff, Vnoff, as explained above. The adder 804 then outputs an adjusted or non-adjusted sensed parameter (shown as signal 806) to the error signal generator 808 which compares the signal 806 to the reference signal Vref, and generates the error signal Ve. This error signal Ve is then used by, for example, the controller 710 of FIG. 7 to generate the control signal 614 for controlling the power switch of the power converter 602 as explained above.

Additionally, in the particular embodiment of FIG. 8, the control circuit 802 adjusts the sensed parameter 216 (e.g., the sensed output parameter) with the positive offset signal Vpoff in response to a decrease in the output current (e.g., a load current step from high to low). Similarly, the control circuit 802 adjusts the sensed parameter 216 with the negative offset signal in response to an increase in the output current (e.g., a load current step from low to high), as explained above. This change in the output current can be determined based on the sensed parameter 216 and/or another suitable parameter as explained herein.

Figure 9:
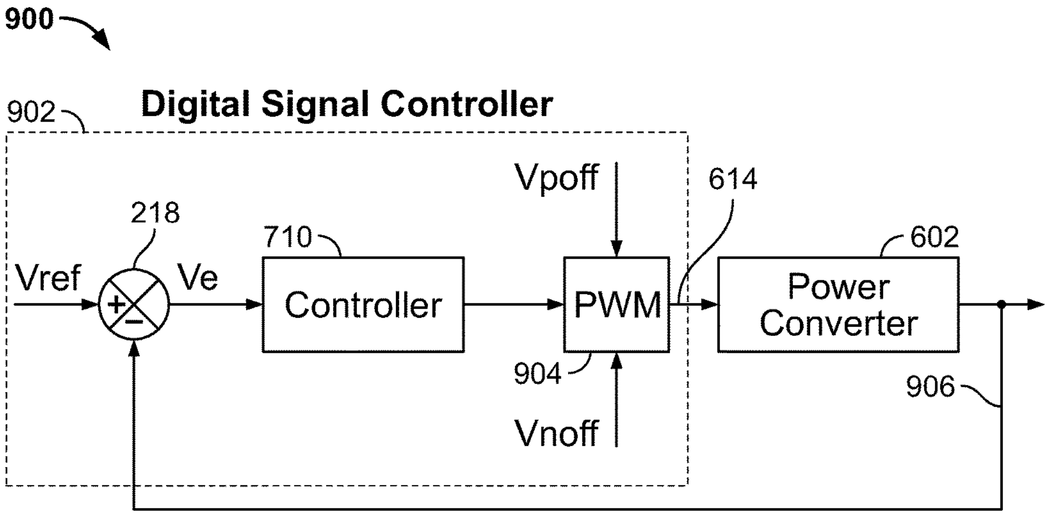
FIG. 9 is a block diagram of a switched mode power supply including a control circuit that selectively applies one of a positive offset signal and a negative offset signal to a PWM driver according to another example embodiment.

In some embodiments, offset signals can be applied to components to adjust a duty cycle and/or a frequency of a control signal without changing the magnitude of an error signal. For example, FIG. 9 illustrates a power supply 900 including the power converter 602 of FIG. 6 and a control circuit 902 for generating the control signal(s) 614 for controlling one or more power switches in the power converter 602, as explained above. The control circuit 902 includes the error signal generator 218 of FIG. 2, a PWM driver 904, and the controller 710 of FIG. 7 coupled between the error signal generator 218 and the PWM driver 904. As shown in FIG. 9, the PWM driver 904 receives (at times) offset signals Vpoff, Vnoff.

For example, the error signal generator 218 of FIG. 2 compares a sensed output parameter 906 of the power converter 602 to a reference signal Vref and generates an error signal Ve based on this comparison. This error signal Ve (after passing through the controller 910) is compared to an oscillator signal in the PWM driver 904 to generate a duty cycle for the control signal(s) 614.

The offset signals Vpoff, Vnoff (when applied) can be used to change a maximum value of this oscillator signal to adjust the duty cycle of the control signal(s) 614. In such examples, the positive offset signal Vpoff may increase the maximum value of the oscillator signal when applied. Likewise, the negative offset signal Vnoff may decrease the maximum value of the oscillator signal when applied. Thus, the offset signals Vpoff, Vnoff (when applied) each can adjust the duty cycle of the control signal(s) 614 without, for example, adjusting the error signal Ve.

The offset signals Vpoff, Vnoff can be applied in response to a change in the output current as explained above.

Figure 10:
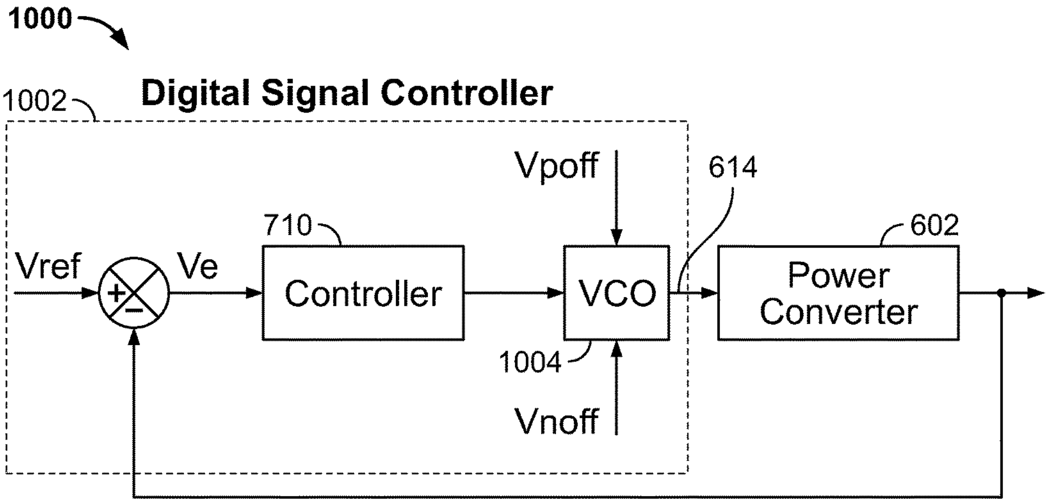
FIG. 10 is a block diagram of a switched mode power supply including a control circuit that selectively applies one of a positive offset signal and a negative offset signal to a voltage controlled oscillator according to yet another example embodiment.

FIG. 10 illustrates a power supply 1000 substantially similar to the power supply 900 of FIG. 9, but including a control circuit 1002 having a voltage controlled oscillator VCO instead of a PWM driver. In particular, the control circuit 1002 includes the controller 710 of FIG. 7 and a VCO 1004 coupled to the controller 710. The VCO 1004 modulates a frequency of the control signal(s) 614 for controlling one or more power switches in the power converter 602, as explained above.

As shown in FIG. 10, the VCO 1004 receives one of the offset signals Vpoff, Vnoff in response to a change in the output current, as explained above. For example, the positive offset signal Vpoff may change one or more parameters (e.g., a voltage drop, etc.) in the VCO 1004 when applied. This change in the parameter(s) causes the frequency to modulate differently than without the offset signal applied. Similarly, the negative offset signal Vnoff may change the same and/or different parameter(s) in the VCO 1004 when applied to causes the frequency to modulate differently. Thus, the offset signals Vpoff, Vnoff (when applied) each can adjust the frequency of the control signal(s) 614 without, for example, adjusting the error signal Ve.

The control circuits disclosed herein may include an analog control circuit, a digital control circuit (e.g., a digital signal controller (DSC), a digital signal processor (DSP), etc.), or a hybrid control circuit (e.g., a digital control unit and an analog circuit). Additionally, the entire control circuit, some of the control circuit, or none of the control circuit may be positioned on an integrated circuit.

In some embodiments, the control circuits preferably include digital control circuitry. For example, the control circuits 702, 802, 902, 1002 of FIGS. 7-10 are shown as digital signal controllers. Each digital signal controller 702, 802, 902, 1002 includes a controller 710 for generating the control signal 614 as explained herein. The controller 710 can include, for example, one or more PID controllers, PI controllers and/or other suitable control circuitry.

Figure 11:
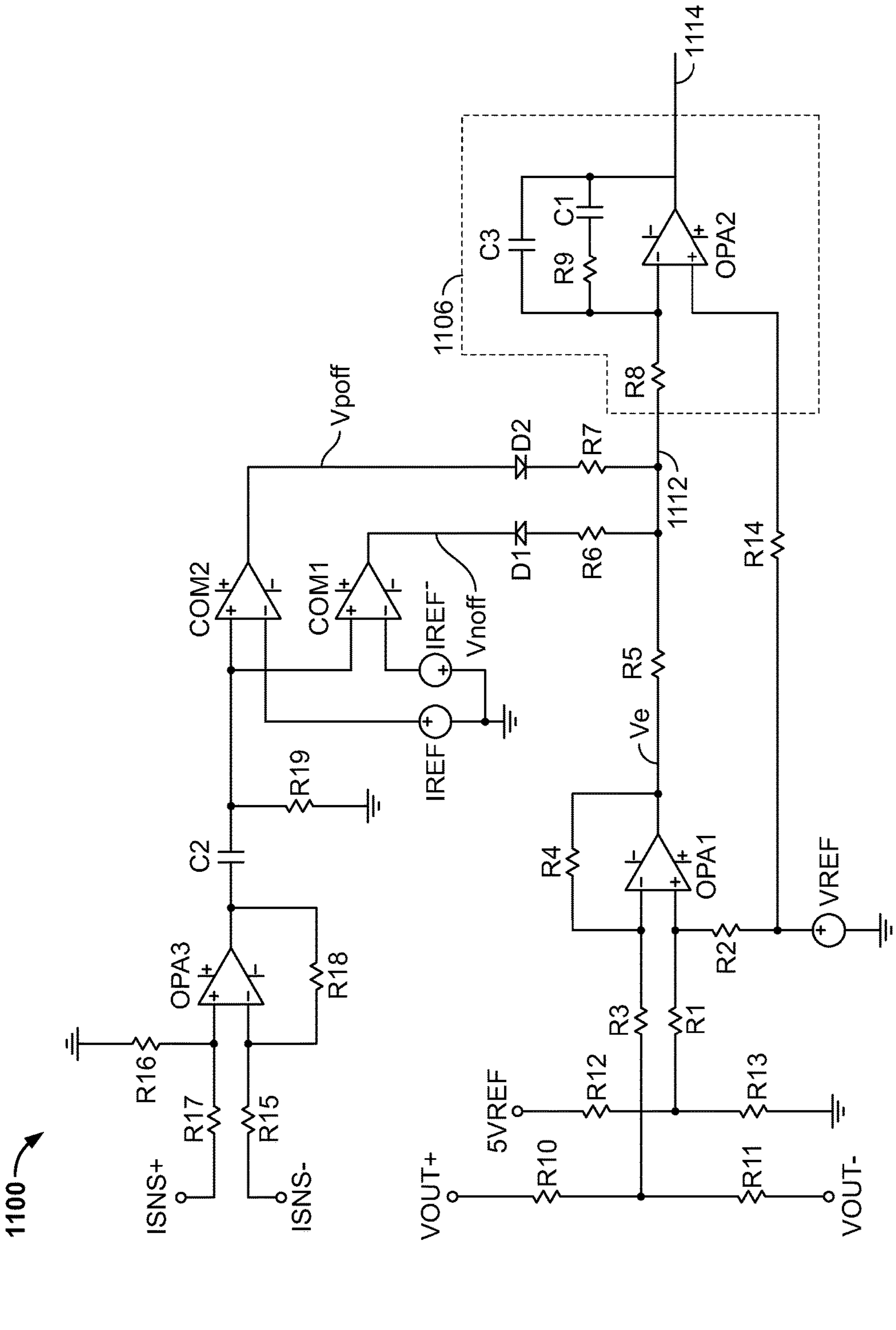
FIG. 11 is a block diagram of an analog control circuit that selectively applies one of a positive offset signal and a negative offset signal according to another example embodiment.

In other embodiments, the control circuits disclosed herein may include analog control circuitry. For example, FIG. 11 illustrates an analog control circuit 1100 representing the control circuit 604 of FIG. 6. As shown in FIG. 11, the control circuit 1100 includes resistors R6, R7, R15, R16, R17, R18, R19, operational amplifiers OPA1, OPA3, a capacitor C2 and comparators COM1, COM2. The operational amplifier OPA1 generates an error signal Ve, as explained herein.

The comparators COM1, COM2 and the resistors R6, R7 coupled to the comparators COM1, COM2, respectively, generate offset signals. For example, an output of the comparator COM1 corresponds to a negative offset signal Vnoff, and is scalable to a particular magnitude by the resistor R6. Similarly, an output of the comparator COM2 corresponds to a positive offset signal Vpoff, and is scalable to a particular magnitude by the resistor R7.

The control circuit 1100 determines a change in an output current of a power circuit (not shown) via the resistors R15, R16, R17, R18 and the operational amplifier OPA3. When the change in the output current is zero, a voltage across the resistor R19 is zero due to the capacitor C2 functioning as a DC-blocking capacitor.

In such examples, the comparator COM2 compares the voltage across the resistor R19 (e.g., zero) to a reference voltage IREF (e.g., a positive reference voltage), and outputs a low value (e.g., a zero) because the reference voltage IREF is larger than the voltage across the resistor R19. In this case, the diode D2 is reversed biased, and therefore a positive offset is not applied to the error signal Ve from the comparator COM2. Conversely, the comparator COM1 compares the voltage across the resistor R19 to a reference voltage IREF' (e.g., a negative reference voltage), and outputs a high value (e.g., a one) because the reference voltage IREF' is smaller than the voltage across the resistor R19. However, a negative offset is not applied to the error signal Ve from the comparator COM1 because the diode D1 is reverse biased. Thus, no offset is applied to the error signal Ve when the change in the output current is zero.

If, however, a change in the output current is detected, the voltage across the resistor R19 changes. As explained above, this change in the output current can be an increase or a decrease. For example, if a value of the voltage across the resistor R19 is larger than both reference voltages IREF, IREF' (e.g., due to an increase in the output current), both comparators COM1, COM2 output a high value. However, because the diode D2 is forward biased and the diode D1 is reverse biased, the output from the comparator COM2 is used to increase the error signal Ve (e.g., the positive offset is applied).

If a value of the voltage across the resistor R19 is smaller than both reference voltages IREF, IREF' (e.g., due to a decrease in the output current), both comparators COM1, COM2 output a low value. In this case, the diode D2 is reversed biased and the diode D1 is forward biased. As such, the output from the comparator COM1 is used to decrease the error signal Ve (e.g., the negative offset is applied).

Thus, the control circuit 1100 can adjust the error signal Ve with one of the offset signals Vpoff, Vnoff (if applicable). This adjusted or non-adjusted error signal (shown as signal 1112) is then provided to component(s) 1106 which generate a control signal 1114 for controlling one or more power switches in a power circuit, as explained above.

Additionally, the resistor R19 in combination with the capacitor C2 can serve as a delay. For example, a user can design the resistor R19 and the capacitor C2 to generate a defined delay to incorporate a time-based offset, as explained above.

A change in an output current may be detected (e.g., sensed, calculated, etc.) in any suitable manner. For example, an output current of a power circuit can be sensed. In such examples, the output current is the sensed parameter as explained above. Additionally and/or alternatively, an input side parameter (e.g., an input current, a primary side current if the power circuit includes a transformer, etc.) may be sensed and used to detect a change in the output current.

In other examples, an output voltage of a power circuit can be sensed and therefore be the sensed parameter. For example, an output voltage of a power circuit can change due to a step change in a load current of a load coupled to the power circuit. This change in the output voltage may depend on, for example, parasitic components of an output filter (e.g., an LC filter, etc.), bandwidth of a control loop, etc. The parasitic components may include an equivalent series resistance (ESR), equivalent series inductance (ESL), etc. The initial change in the output voltage may be due to the ESR and ESL of the output filter and further change in the output voltage may be due to control loop response. For example, a change in the output voltage may be determined by multiplying the ESR (a known value) by a change in the load current (e.g., an output current of the power circuit). As such, the change in the load current can be derived based on the sensed output voltage.

The sensed parameter disclosed herein may be sensed with any suitable sensor. For example, a current sense resistor, a Hall effect sensor, etc. may be employed if the sensed parameter is current (e.g., an output current, input current, etc.).

Additionally, the control circuits disclosed herein can determine the polarity of the change in the output current based on the sensed parameter to determine which offset signal Vpoff, Vnoff to apply. For example, the sensed parameter (e.g., the output current, the output voltage, the input current, etc.) may indicate the output current has increased or decreased. In response, the control circuit may apply one of the positive offset signal and the negative offset signal if appropriate.

In some embodiments, a change in the output current, a change in polarity of the output current, etc. can be calculated using any one of the digital control circuits disclosed herein and/or another suitable digital control circuit. For example, FIG. 12 illustrates a digital control flowchart 1200 for detecting a change in the output current and selectively applying one of a positive offset signal Vpoff and a negative offset signal Vnoff, as explained above.

Figure 12:
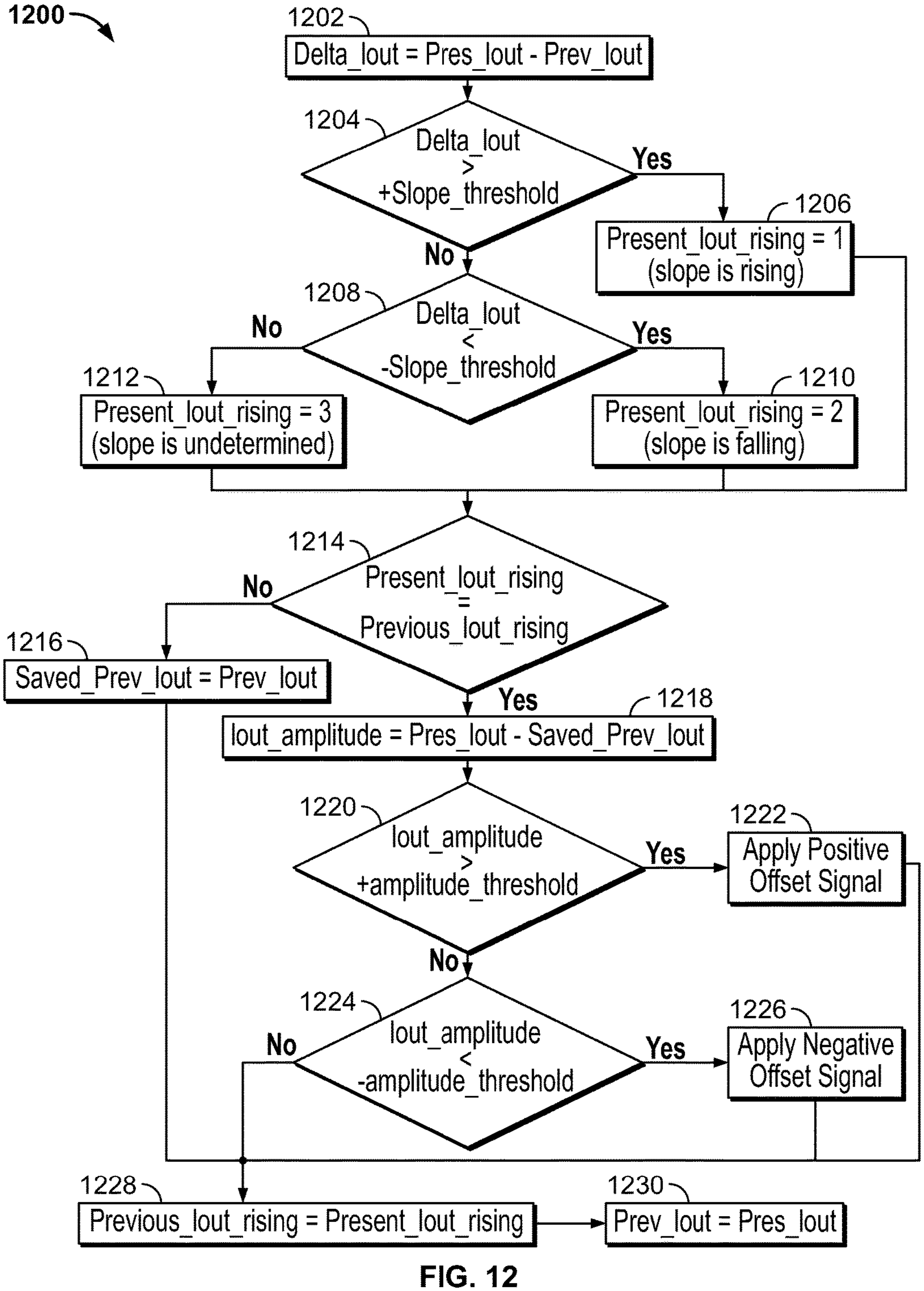
FIG. 12 is a flow diagram for detecting a change in an output current and selectively applying one of a positive offset signal Vpoff and a negative offset signal Vnoff according to yet another example embodiment.

As shown in FIG. 12, a change in the output current (delta_Iout) is calculated by subtracting a previous output current (Prev_Iout) from a present output current (Pres_Iout) in block 1202. For example, the previous output current (Prev_Iout) can represent the amplitude of the output current at time t0 and the present output current (Pres_Iout) can represent the amplitude of the output current at a later time t1. Next, the output current (delta_Iout) is compared to a positive slope threshold (+slope_threshold) in block 1204, and to a negative slope threshold (−slope_threshold) in block 1208, if necessary. The slope thresholds may be defined values at the end (e.g., time t1) of a sampling period (e.g., time t0 to time t1).

If the change in the output current (delta_Iout) is greater than the positive slope threshold (+slope_threshold) in block 1204, a present slope indicator (present_Iout_rising) is set to equal one in block 1206 to indicate the change in the output current (e.g., the slope of the output current) is rising. If the change in the output current (delta_Iout) is not greater than the positive slope threshold (+slope_threshold) in block 1204 and less than the negative slope threshold (−slope_threshold) in block 1208, the present slope indicator (present_Iout_rising) is set to equal two in block 1210. This indicates the slope of the output current is falling. If, however, the change in the output current (delta_Iout) is not greater than the positive slope threshold (+slope_threshold) in block 1204 and not less than the negative slope threshold (−slope_threshold) in block 1208, the present slope indicator (present_Iout_rising) is set to equal three in block 1212. This indicates the slope of the output current is undetermined (e.g., has not changed).

After setting the present slope indicator (present_Iout_rising) to a particular value, the present slope indicator (present_Iout_rising) is compared to a previous slope indicator (previous_Iout_rising) in block 1214. If the present slope indicator (present_Iout_rising) is not equal to the previous slope indicator (previous_Iout_rising) indicating the slope has changed between a positive slope (e.g., a rising slope) and a negative slope (e.g., a falling slope), the previous output current (Prev_Iout) is saved (saved_prev_Iout) in block 1216. If, however, the present slope indicator (present_Iout_rising) is equal to the previous slope indicator (previous_Iout_rising) indicating the slope has remained positive (e.g., remained a rising slope, etc.), negative or unchanged, an amplitude of the output current (Iout_amplitude) is calculated by subtracting the saved previous output current (saved_prev_Iout) from the present output current (Pres_Iout) in block 1218.

Next, the amplitude of the output current (Iout_amplitude) is compared to a positive amplitude threshold (+amplitude_threshold) in block 1220, and to a negative amplitude threshold (−amplitude_threshold) in block 1224, if necessary. If the output current amplitude is greater than the positive amplitude threshold (+amplitude_threshold), a positive offset signal (e.g., the positive offset signal Vpoff) is applied in block 1222. If, however, the output current amplitude is not greater than the positive amplitude threshold (+amplitude threshold) and is less than the negative amplitude threshold (−amplitude_threshold) in block 1224, a negative offset signal (e.g., the negative offset signal Vnoff) is applied in block 1226. The positive and/or offset signals can be applied at various different locations within a control circuit for a defined period of time, as explained above.

If the output current amplitude is not greater than the positive amplitude threshold (+amplitude_threshold) and is not less than the negative amplitude threshold (−amplitude_threshold), the present slope indicator (present_Iout_rising) is set to equal the previous slope indicator (previous_Iout_rising) in block 1228. Additionally, the present output current (Pres_Iout) is set to equal the previous output current (Prev_Iout) in block 1230. After which, the routine can return to calculating the change in the output current in block 1202.

As explained above, the control circuits generate a control signal (e.g., the control signal 214, the control signal 614, etc.) to control any one or more of the power switches disclosed herein. In particular, the component(s) 606 of FIG. 6, controllers 702, 802 of FIGS. 7 and 8, etc. may generate pulse width modulation control signals, frequency modulation control signals, etc. to control one or more power switches.

Any one or more of the methods and/or power converters disclosed herein may be employed in various applications desiring, for example, tight output voltage regulation tolerances, swift dynamic loading response time (e.g., during high slew-rate dynamic load conditions, etc.), etc. Each of these power converters may have any suitable topology. For example, the power converters disclosed herein may include be DC-DC power converters with hard-switching and/or soft-switching resonant converter topologies such as half bridge series resonant converters, full bridge parallel resonant converters, half bridge LLC resonant converters, etc. In other embodiments, the power converters may include AC-DC power converters such as power converters having power factor correction (PFC), flyback converters, etc. In some embodiments, any one of the power converters may be part of a switched mode power supply and/or another suitable power supply.

Additionally, existing control circuits may be updated to include any one or more of the methods disclosed herein. For example, firmware in control circuits of existing systems (e.g., power supplies, power converters, etc.) may be updated so that memory in the control circuits includes instructions for performing the method(s). In other embodiments, the existing control circuits may be updated during their boot loading process. These control circuits, power converters, etc. may be off the shelf products.

In some embodiments, instructions for performing the method(s) in existing control circuits, new control circuits, etc. may be stored on, transferred from, etc. a non-transitory computer readable medium. For example, one or more of the instructions may be stored in volatile memory, nonvolatile memory, ROM, RAM, one or more hard disks, magnetic disk drives, optical disk drives, removable memory, non-removable memory, magnetic tape cassettes, flash memory cards, CD-ROM, DVDs, cloud storage, etc.

By applying the positive offset signal and/or the negative offset signal disclosed herein to adjust one or more control signals, the dynamic response (e.g., the overshoot and the undershoot) of a power converter may be improved compared to known power converters. For example, an output voltage may be regulated at about 48V. By applying the offset signals disclosed herein, an output voltage overshoot may be limited to about 49V and an output voltage undershoot may be limited to about 47V. This represents an approximately +/−2% dynamic range, which is lower than a conventional dynamic range of about +/−5%. This improvement can be seen even if the power converter has been optimized for control loop response.

Additionally, by improving the dynamic response, the power converter's settling time may be decreased compared to conventional power converters. The improved dynamic response, settling time, etc. may be realized without increasing a control loop bandwidth which may adversely affect the phase and gain margin in the system and therefore result in undesirable conditions (e.g., oscillation, etc.).

Further, the positive offset signal and/or the negative offset signal may be implemented with minimal complexity, resources (e.g., memory, processor, etc.), etc. For example, the control circuits implementing the positive offset signal and/or the negative offset signals do not require components, procedures, and other complex and/or resource consuming features to detect, predict, etc. a particular mode of operation (e.g., discontinuous conduction mode, continuous conduction mode, etc.) of its power converter before applying one of the particular offset signals.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A control circuit for controlling a power circuit having an input, an output for providing an output current, and at least one power switch coupled between the input and the output, the control circuit comprising:

a control loop configured to generate a control signal for the at least one power switch of the power circuit based on an error signal determined by comparing a sensed parameter of the power circuit and a reference signal, and a positive offset signal and a negative offset signal each configured to adjust the control signal, the control circuit configured to detect a change in the output current and selectively apply only one of the positive offset signal and the negative offset signal based on the change in the output current of the power circuit to adjust the control signal thereby enhancing a dynamic response to the change in the output current, the control circuit configured to remove said one of the positive offset signal and the negative offset signal applied to adjust the control signal after a defined period of time.

2. The control circuit of claim 1 wherein at least one the positive offset signal and the negative offset signal is variable based on an amount of change in the output current of the power circuit.

3. The control circuit of claim 1 wherein the control circuit is configured to apply the positive offset signal in response to an increase in the output current.

4. The control circuit of claim 1 wherein the control circuit is configured to apply the negative offset signal in response to a decrease in the output current.

5. The control circuit of claim 1 wherein the control circuit is configured to selectively apply said one of the positive offset signal and the negative offset signal if the change in the output current of the power circuit is greater than a defined threshold.

6. The control circuit of claim 1 wherein the control circuit is configured to determine a change in an output voltage of the power circuit corresponding to the change in the output current.

7. The control circuit of claim 1 wherein the sensed parameter includes at least one of the output current of the power circuit and an output voltage of the power circuit.

8. The control circuit of claim 1 wherein the control circuit is configured to apply said one of the positive offset signal and the negative offset signal to the error signal.

9. The control circuit of claim 1 wherein the control circuit is configured to apply said one of the positive offset signal and the negative offset signal to the reference signal.

10. The control circuit of claim 1 wherein the control circuit is configured to apply said one of the positive offset signal and the negative offset signal to the sensed parameter.

11. The control circuit of claim 1 wherein the control circuit includes a pulse width modulation driver and wherein the control circuit is configured to apply said one of the positive offset signal and the negative offset signal to the pulse width modulation driver.

12. The control circuit of claim 1 wherein the control circuit includes a voltage controlled oscillator and wherein the control circuit is configured to apply said one of the positive offset signal and the negative offset signal to the voltage controlled oscillator.

13. The control circuit of claim 1 wherein the control circuit includes a digital control circuit.

14. A power converter including a power circuit having at least one power switch and the control circuit of claim 1 for controlling the at least one power switch.

15. A switched mode power supply comprising:

at least one power converter including one or more power switches and configured to provide an output current, and a control circuit coupled to the at least one power converter, the control circuit including a control loop configured to generate a control signal for the one or more power switches based on an error signal determined by comparing a sensed parameter of the at least one power converter and a reference signal, and a positive offset signal and a negative offset signal each configured to adjust the control signal, the control circuit configured to detect a change in the output current of the at least one power converter and selectively apply only one of the positive offset signal and the negative offset signal based on the change in the output current to adjust the control signal thereby enhancing a dynamic response to the change in the output current, and remove said one of the positive offset signal and the negative offset signal applied to adjust the control signal after a defined period of time.

16. A method of controlling a power switch of a power converter, the method comprising:

generating a control signal for the power switch of the power converter based on an error signal determined by a comparison between a sensed parameter of the power converter and a reference signal, detecting a change in an output current of the power converter, selectively applying only one of a positive offset signal and a negative offset signal based on the change in the output current of the power converter to adjust the control signal, and removing said one of the positive offset signal and the negative offset signal applied to adjust the control signal after a defined period of time.

17. The method of claim 16 wherein selectively applying includes selectively applying said one of the positive offset signal and the negative offset signal if the change in the output current of the power converter is greater than a defined threshold.

18. The method of claim 16 further comprising varying said one of the positive offset signal and the negative offset signal based on an amount of change in the output current of the power converter.

19. The method of claim 18 wherein selectively applying includes applying the positive offset signal in response to an increase in the output current.

20. The method of claim 18 wherein selectively applying includes applying the negative offset signal in response to a decrease in the output current.

* * * * *